(12) United States Patent
Hong et al.

(10) Patent No.: US 9,048,785 B2
(45) Date of Patent: Jun. 2, 2015

(54) PERIODICALLY RESETTING INTEGRATION ANGLE DEMODULATION DEVICE AND METHOD USING THE SAME

(71) Applicant: NATIONAL CHIAO TUNG UNIVERSITY, Hsinchu (TW)

(72) Inventors: Hao-Chiao Hong, Hsinchu (TW); Yun-Tse Chen, Tainan (TW); Shao-Feng Hung, Taichung (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 14/077,458

(22) Filed: Nov. 12, 2013

(65) Prior Publication Data

US 2014/0347122 A1    Nov. 27, 2014

(30) Foreign Application Priority Data

May 21, 2013  (TW) .............................. 102117824 A (51) Int. Cl.
*H03D 3/00* (2006.01)
*H03D 7/16* (2006.01)
(Continued)

(52) U.S. Cl.
CPC ................. *H03D 3/00* (2013.01); *H03D 7/161* (2013.01); *H03D 2200/0021* (2013.01); *H03D 2200/0049* (2013.01); *G01J 9/02* (2013.01); *G01J 9/04* (2013.01)

(58) Field of Classification Search
CPC ......... H03D 3/00; H03D 3/006; H03D 17/16; H03D 17/161; H03D 2200/0021; H03D 2200/0019; H03D 2200/0049; G01J 9/04; G01J 9/02; G01J 9/00; G02F 2/00

USPC ................. 329/345, 346; 359/450, 477, 484; 73/655, 657
See application file for complete search history.

(56) References Cited

U.S. PATENT DOCUMENTS 4,485,358 A * 11/1984 Andren et al. ................ 332/144
4,878,026 A * 10/1989 Moreau et al. ................ 324/547
(Continued)

OTHER PUBLICATIONS

Hao-Chiao Hong, Yun-Tse Chen, Shao-Feng Hung, and Shen-Pai Lin, "IC Design of a Low-Cost Angle Demodulator Using a Novel Periodically Resetting Integration Technique", The 21st Conference on National Defense Science and Technology Thesis, Nov. 23, 2012.
(Continued)

*Primary Examiner* — Ryan Johnson
(74) *Attorney, Agent, or Firm* — Roxenberg, Klein & Lee (57) ABSTRACT

A periodically resetting integration angle demodulation device and a method using the same is disclosed, which uses a waveform multiplier and a periodically resetting integrator to modulate a continuous-time angle modulation signal into a discrete-time signal. The waveform multiplier multiplies the continuous-time angle modulation signal by a square wave signal whose frequency is integer times a carrier frequency, and then transmits the continuous-time angle modulation signal to a periodically resetting integrated circuit. The periodically resetting integrated circuit performs integration during a carrier period to generate a discrete-time angle modulation output signal. The present invention can greatly reduce the difficulty for designing an optical sensing system in the front end without limiting a modulation depth. Besides, the present invention achieves a small volume, high speed, high sensitivity, high reliability, high performance and high condition-adapting properties.

9 Claims, 8 Drawing Sheets

(51) Int. Cl.
*G01J 9/02* (2006.01)
*G01J 9/04* (2006.01)

(56) References Cited

U.S. PATENT DOCUMENTS

| | | | |
|---|---|---|---|
| 5,212,825 | A | 5/1993 | Layton |
| 7,477,100 | B2* | 1/2009 | Ranganathan et al. ....... 329/315 |
| 2005/0285669 | A1* | 12/2005 | Saijo et al. .................... 329/311 |
| 2011/0018626 | A1* | 1/2011 | Kojima ......................... 329/306 |
| 2011/0143685 | A1* | 6/2011 | Cebi .............................. 455/73 |

OTHER PUBLICATIONS

Chen, Yun-Tse and Hong, Hao-Chiao, "Design of a Low-Cost Angle Demodulator IC Using a Novel Periodically Resetting Integration Technique", Department of Electrical and Engineering of National Chiao Tung University Oral Presentation, Nov. 4, 2013.

H. Singh, J.S. Sirkis, J. Andrews, and R. Pulfrey, "Evaluation of Integrated Optic Modulator-Based Detection Schemes for In-Line Fiber Etalon Sensors", J. Lightwave Technol., vol. 13, pp. 1772-1779, 1995.

J.H. Cole, B.A. Danver, and J.A. Bucaro, "Synthetic-Heterodyne Interferometric Demodulation", IEEE J. Quantum Electron, vol. 18, pp. 694-697, 1982.

Lo, Y.L. and Chuang, C.H., "New Synthetic-Heterodyne Demodulation for an Optical Fiber Interferometer", IEEE Journal of Quantum Electronics, vol. 37, No. 5, pp. 658-663, May 2001.

Chen, Yun-Tse and Hong, Hao-Chiao, "Design of a Low-Cost Angle Demodulator IC Using a Novel Periodically Resetting Integration Technique", Department of Electrical and Engineering of National Chiao Tung University Oral Presentation, CIRCA 2013.

* cited by examiner

PERIODICALLY RESETTING INTEGRATION ANGLE DEMODULATION DEVICE AND METHOD USING THE SAME

This application claims priority for Taiwan patent application no. 102117824 filed at May 21, 2013, the content of which is incorporated by reference in its entirety.

BACKGROUND OF THE INVENTION

1. Field of the Invention

The present invention relates to an angle demodulation device and method using the same, particularly to a periodically resetting integration angle demodulation device and a method using the same.

2. Description of the Related Art

An optical sensing system is a sensor to measure acceleration, including those of a piezoresistive pressure sensor, a capacitive sensor, a piezoelectric sensor and an optical sensor, especially the optical sensor with better sensitivity. The optical sensor can apply to the system of high standard without disturbance of electromagnetic radiation, such as an advanced intelligent fuse system.

Figure 1:
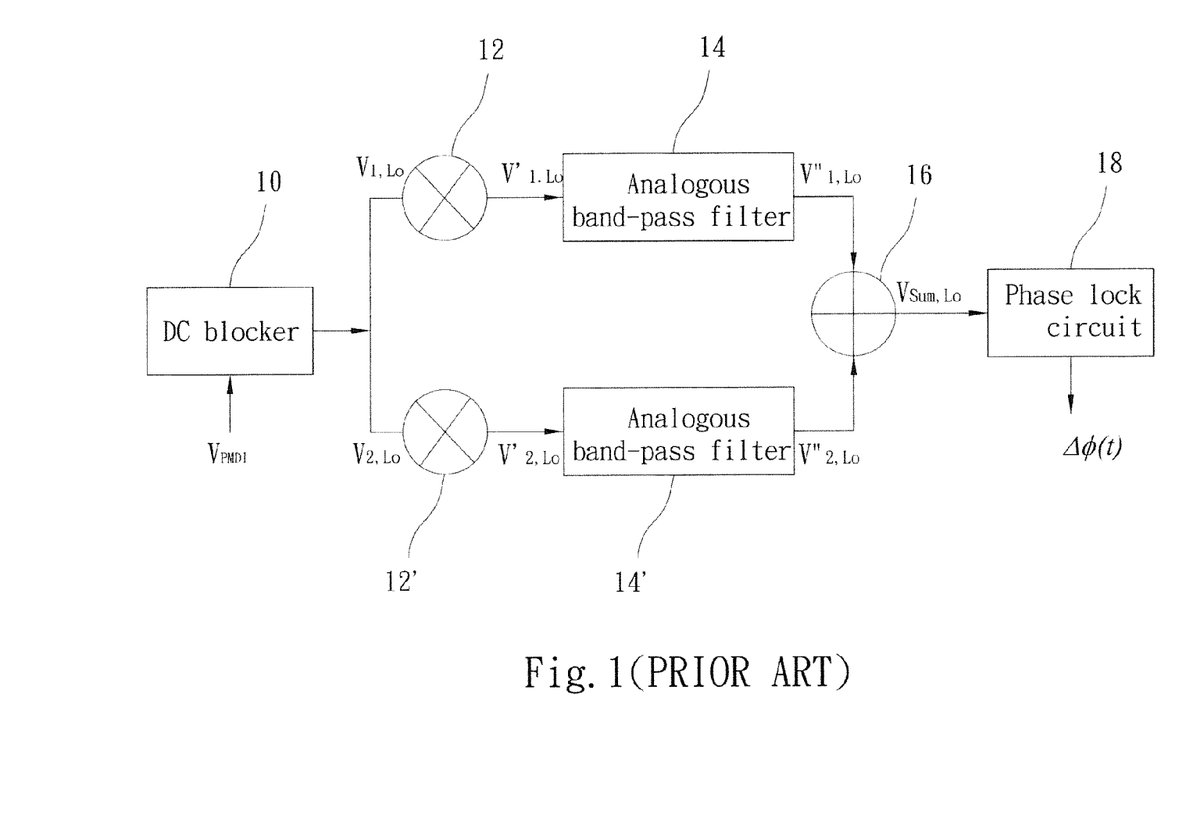
FIG. 1 is a schematic diagram illustrating a circuit in the traditional technology.

Among all kinds of optical accelerometers, Path Matched Differential Interferometry (PMDI) is an effective accelerometer. Presently, there are several kinds of demodulation systems which are references to process the rear-end signals. But circuits of the system are fabricated on a circuit board by using discrete elements. A large volume of the system is not only hard to apply to an optical sensing system but also achieves a purpose of microminiaturizing a whole system. As shown in FIG. 1, the traditional technology has been provided a synthetic heterodyne demodulation circuit. Firstly, an optical fiber and an optical phase-measuring signal are modulated into an angle modulation signal by a sine wave, wherein the angle modulation signal is expressed by an equation (1):

$$V_{PMDI}(t)=A+B\cos[\phi_c \cos(2\pi f_c t)+\Delta\phi(t)] \quad (1)$$

Wherein A and B are constants, $\phi_c$ is a modulation depth, $f_c$ is a modulation frequency, $\Delta\phi(t)$ is an angle variation resulted from acceleration. A direct-current (DC) blocker 10 receives the angle modulation signal and filters out a DC signal of the angle modulation signal to generate an alternative-current (AC) signal. According to Fourier-Bessel theory, the AC signal is expressed by an equation (2):

$$V_{PMDI}(t) = \quad (2)$$
$$A + B\left\{\left[J_0(\phi_c) + 2\sum_{k=1}^{\infty}(-1)^k J_{2k}(\phi_c)\cos(4k\pi f_c t)\right]\cos(\Delta\phi(t)) - \left[2\sum_{k=0}^{\infty}(-1)^k J_{2k+1}(\phi_c)\cos(2(2k+1)\pi f_c t)\right]\sin(\Delta\phi(t))\right\}$$

The AC signals $V_{1,Lo}$ and $V_{2,Lo}$ are respectively transmitted to an analogous multipliers 12 and 12' and the AC signal $V_{1,Lo}$ are multiplied by $\cos(2\pi f_c t)$ and simplified by a way of product to sum to obtain an equation (3):

$$V'_{1,Lo}(t) = V_{1,Lo}(t) \times \cos(2\pi f_c t) \Rightarrow V'_{1,Lo}(t) = \quad (3)$$
$$C'_{1,0}\sin(\Delta\phi(t)) + C'_{1,1}\cos(2\pi f_c t)\cos(\Delta\phi(t)) +$$

-continued
$$C'_{1,2}\cos(4\pi f_c t)\sin(\Delta\phi(t)) + C'_{1,3}\cos(6\pi f_c t)\cos(\Delta\phi(t)) + \ldots$$

Then, an analogous band-pass filter 14 with central frequency f ID receives $V_{1,Lo}'(t)$ to generate an output signal expressed by an equation (4):

$$V_{1,Lo}''(t)=C'_{1,1}\cos(2\pi f_c t)\cos(\Delta\phi(t)) \quad (4)$$

Similarly, the AC signal $V_{2,Lo}(t)$ is multiplied by $\sin(4\pi f_c t)$ and simplified by a way of product to sum to obtain an equation (5). Another analogous band-pass filter 14' with central frequency $f_c$ receives $V'_{1,Lo}(t)$ to generate an output signal expressed by an equation (6).

$$V'_{2,Lo}(t) = V_{2,Lo}(t) \times \sin(4\pi f_c t) \Rightarrow V'_{2,Lo}(t) = C'_{2,1}\sin(2\pi f_c t)\sin(\Delta\phi(t)) + \quad (5)$$
$$C'_{2,2}\sin(4\pi f_c t)\cos(\Delta\phi(t)) + C'_{2,3}\sin(6\pi f_c t)\sin(\Delta\phi(t)) + \ldots$$

$$V''_{2,Lo}(t) = C'_{2,1}\sin(2\pi f_c t)\sin(\Delta\phi(t)) \quad (6)$$

Then, $V''_{1,Lo}(t)$ and $V''_{2,Lo}(t)$ are transmitted to analogous adder 16 and added, and a modulation depth is adjusted to comply with an equation (7):

$$C'_{1,1}=C'_{2,1} \Rightarrow B(J_3(\phi_c)-J_1(\phi_c))=-BJ_2(\phi_c) \quad (7)$$

When $V''_{1,Lo}(t)$ and $V''_{2,Lo}(t)$ comply with the equation (7), $V''_{1,Lo}(t)$ and $V''_{2,Lo}(t)$ are added to obtain a simple sine wave expressed by an equation (8):

$$V_{Sum,Lo}(t) = V''_{1,Lo}(t) + V''_{2,Lo}(t) \Rightarrow V_{Sum,Lo}(t) = \quad (8)$$
$$C'_{1,1}\cos(2\pi f_c t)\cos(\Delta\phi(t)) + C'_{2,1}\sin(2\pi f_c t)\sin(\Delta\phi(t)) \Rightarrow V_{Sum,Lo}(t) =$$
$$D\cos(2\pi f_c t - \Delta\phi(t))$$

After passing through a signal-demodulating process circuit, a signal becomes the sine wave. Finally, the sine wave is transmitted to a phase lock circuit 18 to be demodulated into an angle variation $\Delta\phi(t)$ required. As a result, sense data of a sensor is obtained.

According to the abovementioned derivation, the equation (7) is established to satisfy the equation (8), and a value of the modulation depth is very important. As a result, $\phi_c$ is limited to 2.2, which is not flexible enough to design the optical sensing system of PMDI. In addition, the upper limit of a carrier frequency is limited, thereby affecting a bandwidth of the sensor. Theoretically, the upper limit of the bandwidth of the sensor is 1/10 $f_c$. Thus, it is difficult for the circuit architecture to design an integrated circuit (IC) since each element of the circuit has complex design and the whole circuit area required is too large to be encapsulated in a chip. Specifically, two band-pass filters 14 and 14' required have complex design and large volumes since the design requires the information of a single frequency ($f_c$, $2f_c$). Additionally, high-frequency harmonic waves of the equations (3) and (5) are completely filtered out by the analogous band-pass filters 14 and 14', otherwise the accuracy of an output signal is influenced.

In practice, each band-pass filter has a design of as high as ten or more order which means that the band-pass filter requires ten or more operation amplifiers and larger capacitors and resistors. The demand limits a possibility to use the architecture to realize an IC. Besides, the circuit architecture requires high linearity of the analogous multipliers 12 and 12'. If the analogous multipliers have nonlinearity, harmonic waves appear in the result of the analogous multipliers to result in distortion. Also, the circuit architecture requires pure sine waves with frequency of $f_c$ and $2f_c$. Either an external instrument or an oscillator can generate the sine wave. The instrument and the oscillator consume the cost and cannot provide pure sine waves with frequency of $f_c$ and $2f_c$, which results in distortion of the demodulated signal. In other words, the angle variation $\Delta\phi(t)$ is precisely obtained by merely using a high-linearity analogous multiplier, a pure sine wave generator and a high-order band-pass filter, which is the present bottleneck for designing a micro integrated circuit. And, the problems of too large areas of resistors and capacitors, high design complexity, high power consumption and bad linearity exist. Accordingly, how to reduce circuit elements required should be solved whereby the circuit elements are realized in a limited chip area without affecting the normal function of the circuit. To overcome the abovementioned problems, the present invention provides a periodically resetting integration angle demodulation device and a method using the same, so as to solve the afore-mentioned problems of the prior art.

SUMMARY OF THE INVENTION

A primary objective of the present invention is to provide an angle demodulation device and a method using the same, which uses a periodically resetting integration technology to reduce circuit elements required and obtain a precise angle demodulation signal, thereby achieving a small volume, high speed, high sensitivity, high reliability, high performance and high condition-adapting properties.

A secondary objective of the present invention is to provide a periodically resetting integration angle demodulation device and a method using the same, which provides a simple architecture, greatly reduces the difficulty for designing an optical sensing system in the front end without limiting a modulation depth ($\phi_c$), effectively resolves the problem of linearity and signal distortion of circuits, and reduces capacitances used whereby a integrated circuit can be realized and the yield of the optical sensing system is improved.

To achieve the abovementioned objectives, the present invention provides a periodically resetting integration angle demodulation device, which comprises a waveform multiplier, a continuous-time filter and a periodically resetting integrator (PRI). The continuous-time filter is connected between the PRI and the waveform multiplier. The waveform multiplier receives an alternative-current (AC) signal, multiplying the AC signal by a square wave signal whose frequency is integer times a carrier frequency to generate a first output signal. The continuous-time filter receives the first output signal and filters out a high-frequency signal of the first output signal to generate a second output signal. Finally, the output signal of the PRI is reset, and then the PRI receives the second output signal and integrates the second output signal during a carrier period to eliminate all the carrier frequency with multiple frequency terms. Then, the output of the PRI generates a discrete-time angle demodulation signal every carrier period.

The present invention also provides a periodically resetting integration angle demodulation method, which comprises steps of: multiplying an AC signal by a square wave signal whose frequency is integer times a carrier frequency to obtain a first output signal; filtering out a high-frequency signal of the first output signal to generate a second output signal; and integrating the second output signal to eliminate all the carrier frequency with multiple frequency terms to obtain an angle demodulation signal, and then resetting a discrete-time demodulation output signal of a periodically resetting integrator to zero, and continuing repeating the step of multiplying the angle modulation signal by the square wave signal to obtain the first output signal.

Below, the embodiments are described in detail in cooperation with the drawings to make easily understood the technical contents, characteristics and accomplishments of the present invention.

DETAILED DESCRIPTION OF THE INVENTION

The purpose of microminiaturizing a whole system is not achieved due to the fact that a synthetic heterodyne demodulation circuit is too large fabricated on a large circuit board. In order to overcome the problem, the present invention provides a periodically resetting integration angle demodulation device to simplify the circuit.

Figure 2A:
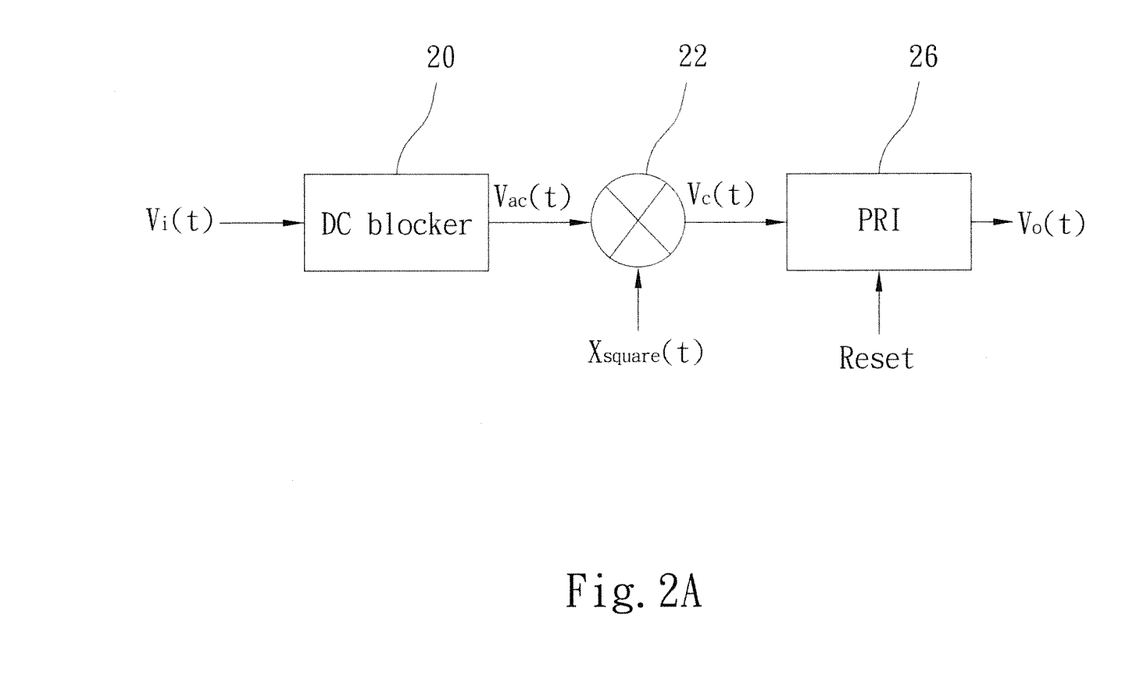
FIG. 2A is a schematic diagram illustrating a circuit according to an embodiment of the present invention.

Refer to FIG. 2A, which is a circuit of the present invention. The angle demodulation device comprises a direct-current (DC) blocker 20, a waveform multiplier 22 and a periodically resetting integration (PRI) 26. The DC blocker 20 is coupled to an optical sensing system (not shown) and uses the optical sensing system (PMDI) to send out an angle modulation signal ($V_{PMDI}(t)$) to the DC blocker 20. The DC blocker 20 is coupled to the waveform multiplier 22. The DC blocker 20 receives the angle modulation signal to filter out a DC signal of the angle modulation signal, and sends out an alternative-current (AC) signal ($V_{ac}(t)$) to the waveform multiplier 22. The waveform multiplier 22 receives an AC signal, multiplying the AC signal by a square wave signal whose frequency is integer times a carrier frequency to generate a first output signal ($V_c(t)$). Finally, the output signal of the PRI 26 is reset, and then the PRI 26 receives the first output signal and integrates the first output signal during a carrier period to eliminate all the carrier frequency with multiple frequency terms. Then, the output of the PRI 26 generates a discrete-time angle demodulation signal every carrier period.

Figure 2B:
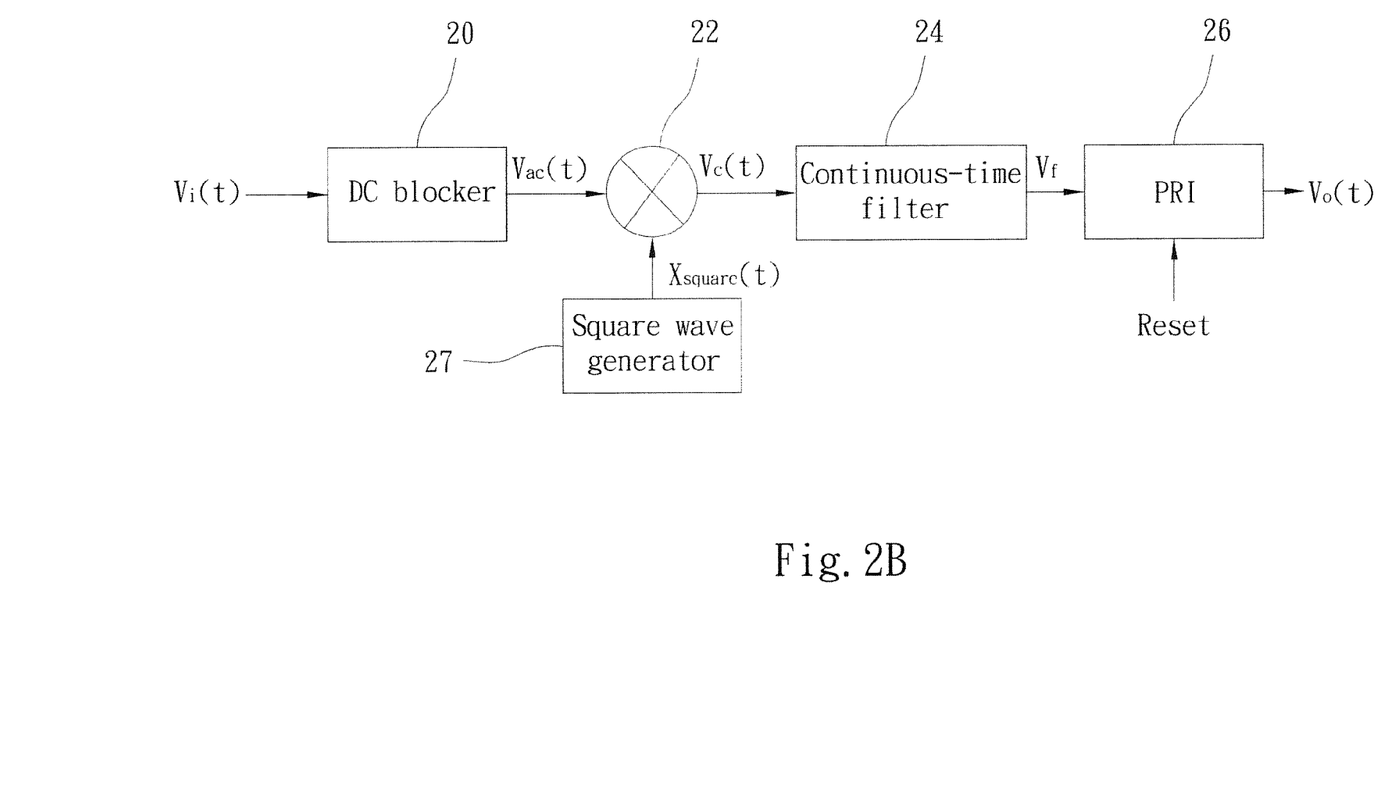
FIG. 2B is a schematic diagram illustrating a circuit according to another embodiment of the present invention.

The first output signal outputted by the waveform multiplier 22 comprises a high-frequency signal. In order to obtain a more precise output signal, refer to FIG. 2A and FIG. 2B. FIG. 2B is another circuit of the present invention. The angle demodulation device further comprises a continuous-time filter 24 coupled to the waveform multiplier 22 and the PRI 26. The DC blocker 20 is coupled to the waveform multiplier 22. The continuous-time filter 24 is a continuous-time low-pass filter or a continuous-time band-pass filter 24. The continuous-time filter 24 is coupled to the waveform multiplier 22 and the PRI 26. In order to understand the present invention for simplifying circuits and obtain the precise angle demodulation signal, the present invention is explained by the deviation of mathematical equations, wherein the angle modulation signal is expressed by an equation (9):

$$V_{PMDI}(t) = A + B \cos[\phi_c \cos(2\pi f_c t) + \Delta\phi(t)] \quad (9)$$

Wherein A and B are constants, $\phi_c$ is a modulation depth, $f_c$ is a modulation frequency, $\Delta\phi(t)$ is an angle variation resulted from acceleration.

Then, according to Fourier-Bessel theory, the angle modulation signal is expressed by an equation $V_i(t)$ (10):

$$V_i(t) = V_{PMDI}(t) \Rightarrow V_i(t) = \quad (10)$$

$$A + B \left\{ \begin{bmatrix} J_0(\phi_c) + 2\sum_{k=1}^{\infty}(-1)^k J_{2k}(\phi_c)\cos(4k\pi f_c t) \end{bmatrix}\cos(\Delta\phi(t)) - \\ \begin{bmatrix} 2\sum_{k=0}^{\infty}(-1)^k J_{2k+1}(\phi_c)\cos(2(2k+1)\pi f_c t) \end{bmatrix}\sin(\Delta\phi(t)) \right\}$$

After $V_i(t)$ passing through the DC blocker 20, the DC blocker 20 filters out the DC signal to obtain the AC signal ($V_{ac}(t)$) expressed by an equation (11):

$$V_{ac}(t) = B \left\{ \begin{bmatrix} 2\sum_{k=1}^{\infty}(-1)^k J_{2k}(\phi_c)\cos(4k\pi f_c t) \end{bmatrix}\cos(\Delta\phi(t)) - \\ \begin{bmatrix} 2\sum_{k=0}^{\infty}(-1)^k J_{2k+1}(\phi_c)\cos(2(2k+1)\pi f_c t) \end{bmatrix}\sin(\Delta\phi(t)) \right\} \quad (11)$$

$$V_{ac}(t) = $$
$$B\{-2J_1(\phi_c)\cos(2\pi f_c t)\sin(\Delta\phi(t)) - 2J_2(\phi_c)\cos(4\pi f_c t)\cos(\Delta\phi(t)) +$$
$$2J_3(\phi_c)\cos(6\pi f_c t)\sin(\Delta\phi(t)) + 2J_4(\phi_c)\cos(8\pi f_c t)\cos(\Delta\phi(t)) -$$
$$2J_5(\phi_c)\cos(10\pi f_c t)\sin(\Delta\phi(t)) -$$
$$2J_6(\phi_c)\cos(12\pi f_c t)\cos(\Delta\phi(t)) + 2J_7(\phi_c)\cos(14\pi f_c t)\sin(\Delta\phi(t)) +$$
$$2J_8(\phi_c)\cos(16\pi f_c t)\cos(\Delta\phi(t)) - \ldots\}$$

After the waveform multiplier 22 receives an AC signal, the waveform multiplier 22 multiplies the AC signal by the square wave signal ($x_{square(t)}$) whose frequency is integer times a carrier frequency ($nf_c$) to obtain a first output signal ($V_c(t)$) expressed by an equation (12):

$$V_c(t) = V_{ac}(t) \times x_{square}(t) \Rightarrow V_c(t) = \quad (12)$$

$$\begin{bmatrix} -2J_1(\phi_c)\cos(2\pi f_c t)\sin(\Delta\phi(t)) - \\ 2J_2(\phi_c)\cos(4\pi f_c t)\cos(\Delta\phi(t)) + \\ 2J_3(\phi_c)\cos(6\pi f_c t)\sin(\Delta\phi(t)) + \\ 2J_4(\phi_c)\cos(8\pi f_c t)\cos(\Delta\phi(t)) - \\ 2J_5(\phi_c)\cos(10\pi f_c t)\sin(\Delta\phi(t)) - \\ 2J_6(\phi_c)\cos(12\pi f_c t)\cos(\Delta\phi(t)) + \\ 2J_7(\phi_c)\cos(14\pi f_c t)\sin(\Delta\phi(t)) - \ldots + \\ 2J_8(\phi_c)\cos(16\pi f_c t)\cos(\Delta\phi(t)) - \ldots \end{bmatrix} \times$$

-continued $$\left[ \frac{4}{\pi} \sum_{k=1}^{\infty} \frac{\cos[(2k-1)2n\pi f_c t]}{(2k-1)} \right] \Rightarrow$$

$$V_c(t) = \begin{bmatrix} -2J_1(\phi_c)\cos(2\pi f_c t)\sin(\Delta\phi(t)) - \\ 2J_2(\phi_c)\cos(4\pi f_c t)\cos(\Delta\phi(t)) + \\ 2J_3(\phi_c)\cos(6\pi f_c t)\sin(\Delta\phi(t)) + \\ 2J_4(\phi_c)\cos(8\pi f_c t)\cos(\Delta\phi(t)) - \\ 2J_5(\phi_c)\cos(10\pi f_c t)\sin(\Delta\phi(t)) - \\ 2J_6(\phi_c)\cos(12\pi f_c t)\cos(\Delta\phi(t)) + \\ 2J_7(\phi_c)\cos(14\pi f_c t)\sin(\Delta\phi(t)) - \ldots + \\ 2J_8(\phi_c)\cos(16\pi f_c t)\cos(\Delta\phi(t)) - \ldots \end{bmatrix} \times$$

$$\frac{4}{\pi} \begin{bmatrix} +\cos(2n\pi f_c t) - \\ \frac{1}{3}\cos(6n\pi f_c t) + \\ \frac{1}{5}\cos(10n\pi f_c t) - \\ \frac{1}{7}\cos(14n\pi f_c t) + \ldots \end{bmatrix} \Rightarrow V_c(t) =$$

$$V_{c1}(t) + V_{c2}(t) + V_{c3}(t) + V_{c4}(t) + \ldots + V_{cn}(t)$$

Every terms expands:

$$V_{c1}(t) = V_{ac}(t) \times \frac{4}{\pi}[+\cos(2n\pi f_c t)] \Rightarrow V_{c1}(t) =$$

$$\frac{4}{\pi} \begin{bmatrix} -2J_1(\phi_c)\cos(2\pi f_c t)\cos(2n\pi f_c t)\sin(\Delta\phi(t)) - \\ 2J_2(\phi_c)\cos(4\pi f_c t)\cos(2n\pi f_c t)\cos(\Delta\phi(t)) + \\ 2J_3(\phi_c)\cos(6\pi f_c t)\cos(2n\pi f_c t)\sin(\Delta\phi(t)) + \\ 2J_4(\phi_c)\cos(8\pi f_c t)\cos(2n\pi f_c t)\cos(\Delta\phi(t)) - \\ 2J_5(\phi_c)\cos(10\pi f_c t)\cos(2n\pi f_c t)\sin(\Delta\phi(t)) - \\ 2J_6(\phi_c)\cos(12\pi f_c t)\cos(2n\pi f_c t)\cos(\Delta\phi(t)) + \\ 2J_7(\phi_c)\cos(14\pi f_c t)\cos(2n\pi f_c t)\sin(\Delta\phi(t)) - \ldots + \\ 2J_8(\phi_c)\cos(16\pi f_c t)\cos(2n\pi f_c t)\cos(\Delta\phi(t)) - \ldots \end{bmatrix} \Rightarrow V_{c1}(t) =$$

$$\frac{4}{\pi} \begin{bmatrix} -J_1(\phi_c)[\cos((2+2n)\pi f_c t) + \cos((2-2n)\pi f_c t)]\sin(\Delta\phi(t)) - \\ J_2(\phi_c)[\cos((4+2n)\pi f_c t) + \cos((4-2n)\pi f_c t)]\cos(\Delta\phi(t)) + \\ J_3(\phi_c)[\cos((6+2n)\pi f_c t) + \cos((6-2n)\pi f_c t)]\sin(\Delta\phi(t)) + \\ J_4(\phi_c)[\cos((8+2n)\pi f_c t) + \cos((8-2n)\pi f_c t)]\cos(\Delta\phi(t)) - \\ J_5(\phi_c)[\cos((10+2n)\pi f_c t) + \cos((10-2n)\pi f_c t)]\sin(\Delta\phi(t)) - \\ J_6(\phi_c)[\cos((12+2n)\pi f_c t) + \cos((12-2n)\pi f_c t)]\cos(\Delta\phi(t)) + \\ J_7(\phi_c)[\cos((14+2n)\pi f_c t) + \cos((14-2n)\pi f_c t)]\sin(\Delta\phi(t)) - \ldots + \\ J_8(\phi_c)[\cos((16+2n)\pi f_c t) + \cos((16-2n)\pi f_c t)]\cos(\Delta\phi(t)) - \ldots \end{bmatrix}$$

$$V_{c2}(t) = V_{ac}(t) \times \frac{4}{\pi}\left[-\frac{1}{3}\cos(6n\pi f_c t)\right] \Rightarrow V_{c2}(t) =$$

$$\frac{-4}{3\pi} \begin{bmatrix} -2J_1(\phi_c)\cos(2\pi f_c t)\cos(6n\pi f_c t)\sin(\Delta\phi(t)) - \\ 2J_2(\phi_c)\cos(4\pi f_c t)\cos(6n\pi f_c t)\cos(\Delta\phi(t)) + \\ 2J_3(\phi_c)\cos(6\pi f_c t)\cos(6n\pi f_c t)\sin(\Delta\phi(t)) + \\ 2J_4(\phi_c)\cos(8\pi f_c t)\cos(6n\pi f_c t)\cos(\Delta\phi(t)) - \\ 2J_5(\phi_c)\cos(10\pi f_c t)\cos(6n\pi f_c t)\sin(\Delta\phi(t)) - \\ 2J_6(\phi_c)\cos(12\pi f_c t)\cos(6n\pi f_c t)\cos(\Delta\phi(t)) + \\ 2J_7(\phi_c)\cos(14\pi f_c t)\cos(6n\pi f_c t)\sin(\Delta\phi(t)) - \ldots + \\ 2J_8(\phi_c)\cos(16\pi f_c t)\cos(6n\pi f_c t)\cos(\Delta\phi(t)) - \ldots \end{bmatrix} \Rightarrow V_{c2}(t) =$$

-continued $$\frac{-4}{3\pi}\begin{bmatrix} -J_1(\phi_c)[\cos((2+6n)\pi f_c t) + \cos((2-6n)\pi f_c t)]\sin(\Delta\phi(t)) - \\ J_2(\phi_c)[\cos((4+6n)\pi f_c t) + \cos((4-6n)\pi f_c t)]\cos(\Delta\phi(t)) + \\ J_3(\phi_c)[\cos((6+6n)\pi f_c t) + \cos((6-6n)\pi f_c t)]\sin(\Delta\phi(t)) + \\ J_4(\phi_c)[\cos((8+6n)\pi f_c t) + \cos((8-6n)\pi f_c t)]\cos(\Delta\phi(t)) - \\ J_5(\phi_c)[\cos((10+6n)\pi f_c t) + \cos((10-6n)\pi f_c t)]\sin(\Delta\phi(t)) - \\ J_6(\phi_c)[\cos((12+6n)\pi f_c t) + \cos((12-6n)\pi f_c t)]\cos(\Delta\phi(t)) + \\ J_7(\phi_c)[\cos((14+6n)\pi f_c t) + \\ \cos((14-6n)\pi f_c t)]\sin(\Delta\phi(t)) - \ldots + \\ J_8(\phi_c)[\cos((16+6n)\pi f_c t) + \cos((16-6n)\pi f_c t)]\cos(\Delta\phi(t)) - \ldots \end{bmatrix}$$

$$V_{c3}(t) = V_{ac}(t) \times \frac{4}{\pi}\left[+\frac{1}{5}\cos(10n\pi f_c t)\right] \Rightarrow V_{c3}(t) =$$

$$\frac{4}{5\pi}\begin{bmatrix} -2J_1(\phi_c)\cos(2\pi f_c t)\cos(10n\pi f_c t)\sin(\Delta\phi(t)) - \\ 2J_2(\phi_c)\cos(4\pi f_c t)\cos(10n\pi f_c t)\cos(\Delta\phi(t)) + \\ 2J_3(\phi_c)\cos(6\pi f_c t)\cos(10n\pi f_c t)\sin(\Delta\phi(t)) + \\ 2J_4(\phi_c)\cos(8\pi f_c t)\cos(10n\pi f_c t)\cos(\Delta\phi(t)) - \\ 2J_5(\phi_c)\cos(10\pi f_c t)\cos(10n\pi f_c t)\sin(\Delta\phi(t)) - \\ 2J_6(\phi_c)\cos(12\pi f_c t)\cos(10n\pi f_c t)\cos(\Delta\phi(t)) + \\ 2J_7(\phi_c)\cos(14\pi f_c t)\cos(10n\pi f_c t)\sin(\Delta\phi(t)) - \ldots + \\ 2J_8(\phi_c)\cos(16\pi f_c t)\cos(10n\pi f_c t)\cos(\Delta\phi(t)) - \ldots \end{bmatrix} \Rightarrow V_{c3}(t) =$$

$$\frac{4}{5\pi}\begin{bmatrix} -J_1(\phi_c)[\cos((2+10n)\pi f_c t) + \cos((2-10n)\pi f_c t)]\sin(\Delta\phi(t)) - \\ J_2(\phi_c)[\cos((4+10n)\pi f_c t) + \cos((4-10n)\pi f_c t)]\cos(\Delta\phi(t)) + \\ J_3(\phi_c)[\cos((6+10n)\pi f_c t) + \cos((6-10n)\pi f_c t)]\sin(\Delta\phi(t)) + \\ J_4(\phi_c)[\cos((8+10n)\pi f_c t) + \cos((8-10n)\pi f_c t)]\cos(\Delta\phi(t)) - \\ J_5(\phi_c)[\cos((10+10n)\pi f_c t) + \cos((10-10n)\pi f_c t)]\sin(\Delta\phi(t)) - \\ J_6(\phi_c)[\cos((12+10n)\pi f_c t) + \cos((12-10n)\pi f_c t)]\cos(\Delta\phi(t)) + \\ J_7(\phi_c)[\cos((14+10n)\pi f_c t) + \cos((14-10n)\pi f_c t)]\sin(\Delta\phi(t)) - \ldots + \\ J_8(\phi_c)[\cos((16+10n)\pi f_c t) + \cos((16-10n)\pi f_c t)]\cos(\Delta\phi(t)) - \ldots \end{bmatrix}$$

$$V_{c4}(t) = V_{ac}(t) \times \frac{4}{\pi}\left[-\frac{1}{7}\cos(14n\pi f_c t)\right] \Rightarrow V_{c4}(t) =$$

$$\frac{-4}{7\pi}\begin{bmatrix} -2J_1(\phi_c)\cos(2\pi f_c t)\cos(14n\pi f_c t)\sin(\Delta\phi(t)) - \\ 2J_2(\phi_c)\cos(4\pi f_c t)\cos(14n\pi f_c t)\cos(\Delta\phi(t)) + \\ 2J_3(\phi_c)\cos(6\pi f_c t)\cos(14n\pi f_c t)\sin(\Delta\phi(t)) + \\ 2J_4(\phi_c)\cos(8\pi f_c t)\cos(14n\pi f_c t)\cos(\Delta\phi(t)) - \\ 2J_5(\phi_c)\cos(10\pi f_c t)\cos(14n\pi f_c t)\sin(\Delta\phi(t)) - \\ 2J_6(\phi_c)\cos(12\pi f_c t)\cos(14n\pi f_c t)\cos(\Delta\phi(t)) + \\ 2J_7(\phi_c)\cos(14\pi f_c t)\cos(14n\pi f_c t)\sin(\Delta\phi(t)) - \ldots + \\ 2J_8(\phi_c)\cos(16\pi f_c t)\cos(14n\pi f_c t)\cos(\Delta\phi(t)) - \ldots \end{bmatrix} \Rightarrow V_{c4}(t) =$$

$$\frac{-4}{7\pi}\begin{bmatrix} -J_1(\phi_c)[\cos((2+14n)\pi f_c t) + \cos((2-14n)\pi f_c t)]\sin(\Delta\phi(t)) - \\ J_2(\phi_c)[\cos((4+14n)\pi f_c t) + \cos((4-14n)\pi f_c t)]\cos(\Delta\phi(t)) + \\ J_3(\phi_c)[\cos((6+14n)\pi f_c t) + \cos((6-14n)\pi f_c t)]\sin(\Delta\phi(t)) + \\ J_4(\phi_c)[\cos((8+14n)\pi f_c t) + \cos((8-14n)\pi f_c t)]\cos(\Delta\phi(t)) - \\ J_5(\phi_c)[\cos((10+14n)\pi f_c t) + \cos((10-14n)\pi f_c t)]\sin(\Delta\phi(t)) - \\ J_6(\phi_c)[\cos((12+14n)\pi f_c t) + \cos((12-14n)\pi f_c t)]\cos(\Delta\phi(t)) + \\ J_7(\phi_c)[\cos((14+14n)\pi f_c t) + \cos((14-14n)\pi f_c t)]\sin(\Delta\phi(t)) - \ldots + \\ J_8(\phi_c)[\cos((16+14n)\pi f_c t) + \cos((16-14n)\pi f_c t)]\cos(\Delta\phi(t)) - \ldots \end{bmatrix}$$

According to the abovementioned operations, $V_c(t)$ is obtained. The continuous-time filter 24 receives the first output signal ($V_c(t)$) and filters out a high-frequency signal of the first output signal to generate a second output signal ($V_f$). Finally, the PRI 26 receives the second output signal, integrates the second output signal to eliminate all the carrier frequency with multiple frequency terms to obtain an angle demodulation signal ($V_o$), and then resets a discrete-time demodulation output signal to zero. The angle demodulation device further comprises a square wave generator 27 coupled to the waveform multiplier 22 and using the waveform multiplier 22 to send out the square wave signal to the wave multiplier 22.

For example, when the waveform multiplier 22 multiplies the AC signal by the square wave signal ($x_{square(t)}$) whose frequency is integer times the carrier frequency ($nf_c$), wherein N is a natural number, and N=1, 3, 5, 7 . . . , $V_c(t) = V_{c1}(t) + V_{c2}(t) + V_{c3}(t) + V_{c4}(t) + \ldots + V_{cn}(t)$ is expanded as an equation (13):

$$\Rightarrow V_{c,odd}(t) = \begin{bmatrix} C_{0,odd}\cos(0\pi f_c t)\sin(\Delta\phi(t)) + \\ C_{1,odd}\cos(2\pi f_c t)\cos(\Delta\phi(t)) + \\ C_{2,odd}\cos(4\pi f_c t)\sin(\Delta\phi(t)) + \\ C_{3,odd}\cos(6\pi f_c t)\cos(\Delta\phi(t)) + \\ C_{4,odd}\cos(8\pi f_c t)\sin(\Delta\phi(t)) + \\ C_{5,odd}\cos(10\pi f_c t)\cos(\Delta\phi(t)) + \ldots \end{bmatrix} \quad (13)$$

After $V_c(t)$ passes through the PRI 26, the angle demodulation signal ($V_o(t)$) expressed by an equation (14) is obtained:

$$V_{o,odd}(t)|_{t=nT_c} = v_{o,odd}(n) = \int_{(n-1)T_c}^{nT_c} [V_{c,odd}(t)] dt \Rightarrow V_{o,odd}(t) = \quad (14)$$

$$\int_{(n-1)T_c}^{nT_c} \begin{bmatrix} C_{0,odd}\cos(0\pi f_c t)\sin(\Delta\phi(t)) + \\ C_{1,odd}\cos(2\pi f_c t)\cos(\Delta\phi(t)) + \\ C_{2,odd}\cos(4\pi f_c t)\sin(\Delta\phi(t)) + \\ C_{3,odd}\cos(6\pi f_c t)\cos(\Delta\phi(t)) + \\ C_{4,odd}\cos(8\pi f_c t)\sin(\Delta\phi(t)) + \\ C_{5,odd}\cos(10\pi f_c t)\cos(\Delta\phi(t)) + \ldots \end{bmatrix} dt \Rightarrow v_{o,odd}(n) =$$

$$C'_{0,odd}\sin(\Delta\phi(n)) \Rightarrow \Delta\phi(n) = \arcsin\left(\frac{v_{o,odd}(n)}{C'_{0,odd}}\right)$$

From the result, it is known that the PRI 26 integrates the second output signal to eliminate all the carrier frequency with multiple frequency terms ($C_1 \sim C_5$), so as to obtain the angle demodulation signal ($V_o$) required, thereby obtaining the discrete-time angle demodulation output signal being a sine wave.

For example, suppose N=2 4, 6, 8 . . . , and $V_c(t) = V_{c1}(t) + V_{c2}(t) + V_{c3}(t) + V_{c4}(t) + \ldots + V_{cn}(t)$ is expanded as an equation (15):

$$\Rightarrow V_{c,even}(t) = \begin{bmatrix} C_{0,even}\cos(0\pi f_c t)\cos(\Delta\phi(t)) + \\ C_{1,even}\cos(2\pi f_c t)\sin(\Delta\phi(t)) + \\ C_{2,even}\cos(4\pi f_c t)\cos(\Delta\phi(t)) + \\ C_{3,even}\cos(6\pi f_c t)\sin(\Delta\phi(t)) + \\ C_{4,even}\cos(8\pi f_c t)\cos(\Delta\phi(t)) + \\ C_{5,even}\cos(10\pi f_c t)\sin(\Delta\phi(t)) + \ldots \end{bmatrix} \quad (15)$$

After $V_c(t)$ passes through the PRI 26, the angle demodulation signal ($V_o(t)$) expressed by an equation (16) is obtained:

$$V_{o,even}(t)|_{t=nT_c} = v_{o,even}(n) = \int_{(n-1)T_c}^{nT_c} [V_{c,even}(t)] dt \Rightarrow V_{o,even}(t) = \qquad (16)$$

$$\int_{(n-1)T_c}^{nT_c} \begin{bmatrix} C_{0,even}\cos(0\pi f_c t)\cos(\Delta\phi(t)) + \\ C_{1,even}\cos(2\pi f_c t)\sin(\Delta\phi(t)) + \\ C_{2,even}\cos(4\pi f_c t)\cos(\Delta\phi(t)) + \\ C_{3,even}\cos(6\pi f_c t)\sin(\Delta\phi(t)) + \\ C_{4,even}\cos(8\pi f_c t)\cos(\Delta\phi(t)) + \\ C_{5,even}\cos(10\pi f_c t)\sin(\Delta\phi(t)) + \dots \end{bmatrix} dt \Rightarrow v_{o,even}(n) =$$

$$C'_{0,even}\cos(\Delta\phi(n)) \Rightarrow \Delta\phi(n) = \arcsin\left(\frac{V_{o,even}(n)}{C'_{0,even}}\right)$$

From the result, it is known that the PRI 26 integrates the second output signal to eliminate all the carrier frequency with multiple frequency terms ($C_1$~$C_5$), so as to obtain the angle demodulation signal ($V_o$) required, thereby obtaining the discrete-time angle demodulation output signal being a cosine wave.

From the abovementioned derivation, it is known that the phase variation required is modulated to baseband by multiplying the input signal by the square wave signal. Then, the PRI 26 eliminates all the carrier frequency with multiple frequency terms, thereby achieving the purpose of demodulation.

Figure 3A:
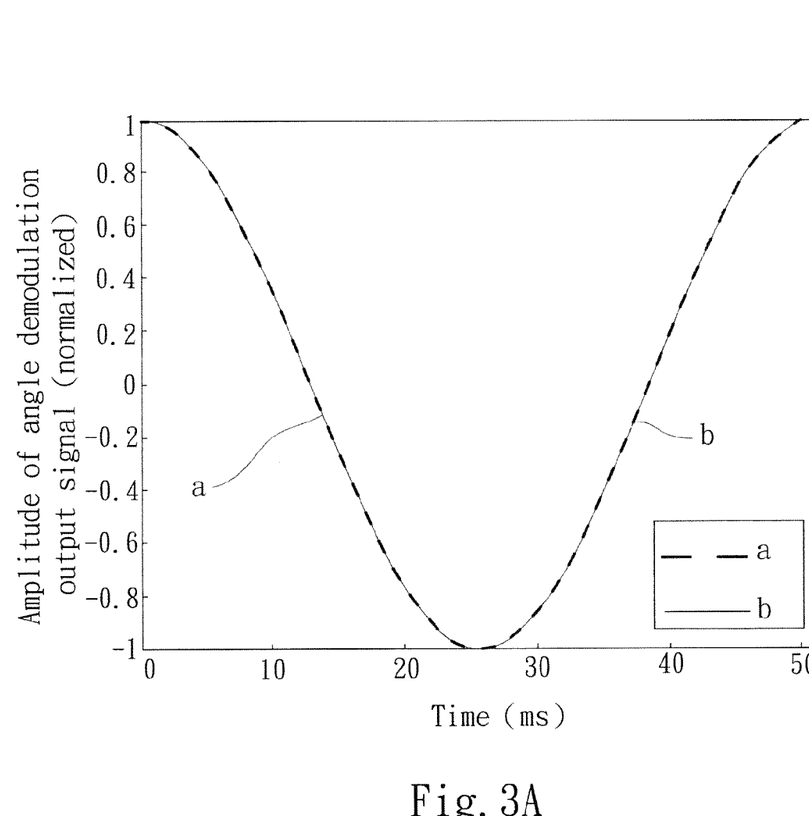
FIG. 3A is a simulated waveform diagram illustrating an angle demodulation signal according to an embodiment of the present invention.
Figure 3B:
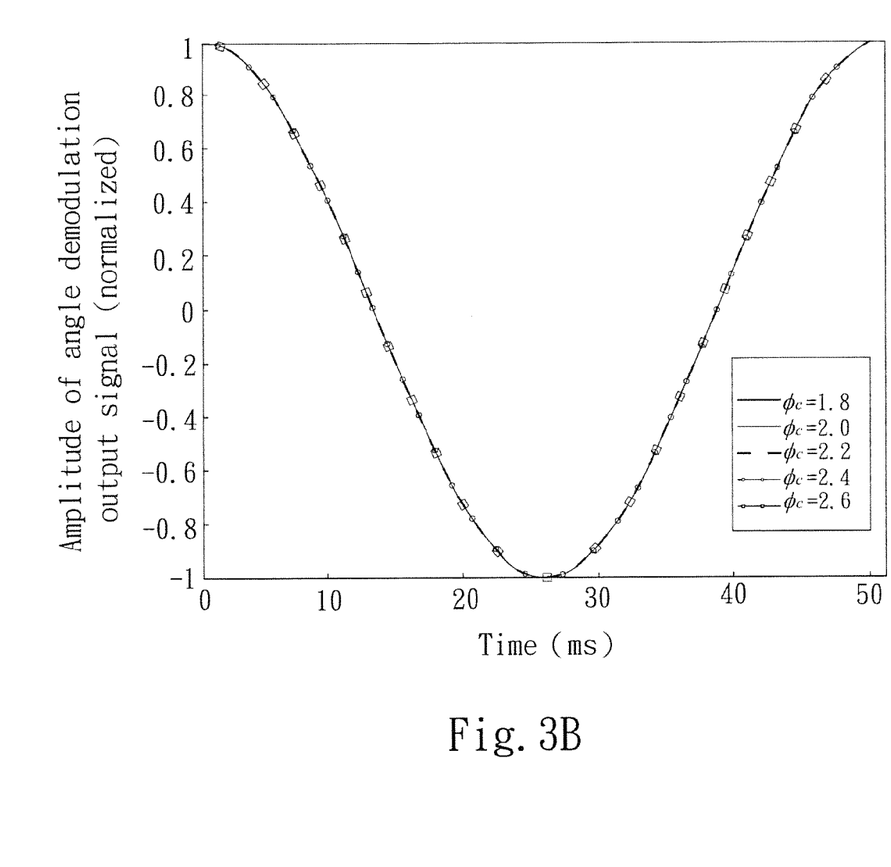
FIG. 3B is a waveform diagram illustrating the angle demodulation signal by changing a modulation depth according to an embodiment of the present invention.

Refer to FIG. 3A which is a simulated waveform diagram illustrating the angle demodulation signal. In order to verify that the simple circuit of the angle modulation device of the present invention is not affected by the modulation depth, each term of the following equation is set:

$$V_{PMDI}(t)=A+B\cos[\phi_c\cos(2\pi f_c t)+\Delta\phi(t)]$$

Wherein A=0.7, B=0.01, $\phi_c$=2.2, $f_c$=100 kHz $$\Delta\phi(t)=K_{ramp}t[\text{Ramp}]\cdot 1/T_s=f_s=256f_c$$

Wherein $\Delta\phi(t)$ is set as ramp function ranging from 0 to $2\pi$. The expected ideal waveform is a segment, and the result is $\nabla_o(n)=\cos(K_{ramp}nT_c)$. The simulated waveform of the angle demodulation device of the present invention is b segment, and the result is $V_{o,behavior}(n)=\cos(k_{ramp}nT_c)$. As shown in FIG. 3A, a and b segments are almost overlapped, which means that the present invention has high precision. Refer to FIG. 3B, which is the comparison result by changing $\phi_c$. From the figures, it is observed that the demodulated result is not related to $\phi_c$. As a result, the optical system can be designed more flexibly. Specifically, the traditional technology strictly limits the modulation depth ($\phi_c$) to a fixed value ($\phi_c$=2.2), otherwise the demodulation signal is distorted. On the contrary, the present invention can greatly reduce the difficulty for designing an optical sensing system in the front end without limiting the modulation depth. The present invention also avoids the signal distortion due to imprecise $\phi_c$.

Figure 4:
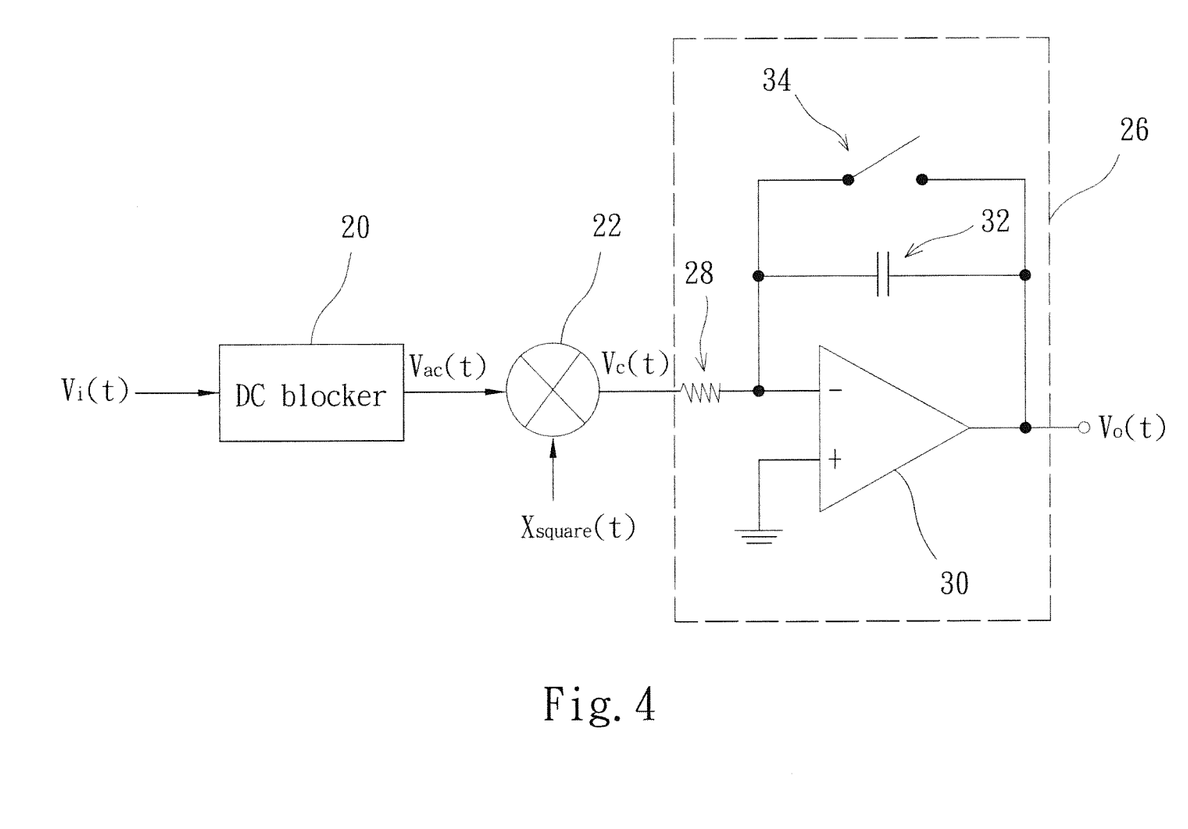
FIG. 4 is a schematic diagram illustrating a circuit using a continuous-time periodically resetting integrator according to an embodiment of the present invention.

The present invention has other advantages except that the angle demodulation device of the present invention can improve the disadvantages of the traditional technology by the abovementioned derivation. Refer to FIG. 2B and FIG. 4. FIG. 4 is a schematic diagram illustrating a circuit using a continuous-time periodically resetting integrator. The waveform multiplier 22 receives an AC signal and multiplies the AC signal by a square wave signal whose frequency is integer times a carrier frequency to obtain a first output signal. The continuous-time filter 24 filters out a high-frequency signal of the first output signal to generate a second output signal. A continuous-time periodically resetting integrator receives the second output signal from the continuous-time filter 24. The continuous-time periodically resetting integrator further comprises a resistor 28, an operation amplifier 30, a capacitor 32 and a switch 34. The resistor 28 is coupled to the continuous-time filter 24 and an input of the operation amplifier 30, and the capacitor 32 is coupled to the resistor 28 and an output of the operation amplifier 30, and the switch 34 is coupled to the capacitor 32 in parallel. In operation, the second output signal charges the capacitor 32 through the resistor 28 and drives the operation amplifier 30 to perform integration. After the operation amplifier 30 performs integration, the switch 34 switches a conduction state thereof to discharge the capacitor 32 so that an output signal of the operation amplifier 30 in the PRI 26 is reset to zero, so as to avoid saturating the output signal of the operation amplifier 30 due to long-time integration.

Figure 5:
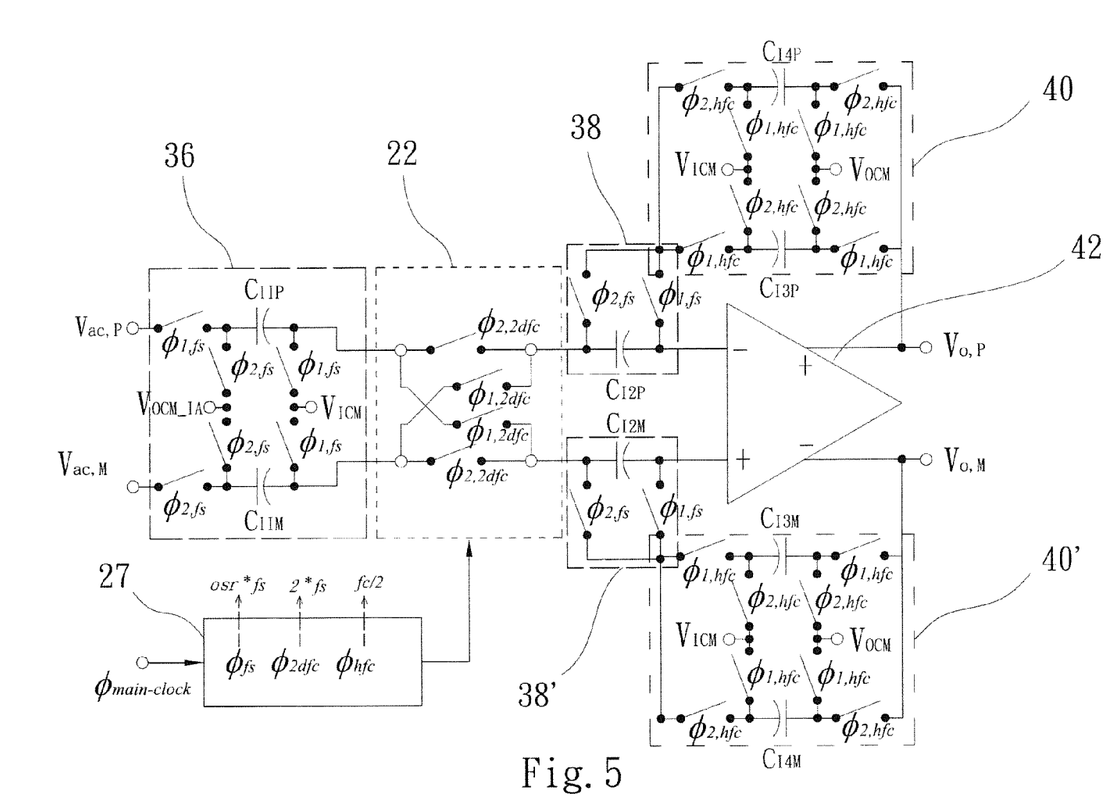
FIG. 5 is a schematic diagram illustrating a circuit using a discrete-time periodically resetting integrator according to an embodiment of the present invention.

Refer to FIG. 2B and FIG. 5. FIG. 5 is a schematic diagram illustrating a circuit using a discrete-time periodically resetting integrator. The waveform multiplier 22 is integrated in the discrete-time periodically resetting integrator 26. The discrete-time periodically resetting integrator 26 further comprises a fully-differential periodically resetting integrated switched-capacitor sampling and holding circuit 36, fully-differential correlated-double sampling switched-capacitor circuits 38 and 38', fully-differential periodically resetting integrated switched-capacitor circuits 40 and 40' and an operation amplifier 42. The fully-differential periodically resetting integrated switched-capacitor sampling and holding circuit 36 is coupled to the waveform multiplier 22, and the fully-differential correlated-double sampling switched-capacitor circuits 38 and 38' are coupled to the waveform multiplier 22 and an input of the operation amplifier 42. The fully-differential periodically resetting integrated switched-capacitor circuit 40 is coupled to the fully-differential correlated-double sampling switched-capacitor circuit 38 and an output of the operation amplifier 42. The fully-differential periodically resetting integrated switched-capacitor circuit 40' is coupled to the fully-differential correlated-double sampling switched-capacitor circuit 38' and the output of the operation amplifier 42. In operation, capacitors $C_{I1M}$ and $C_{I1P}$ of the fully-differential periodically resetting integrated switched-capacitor sampling and holding circuit 36 sample the continuous AC signal outputted by the DC blocker 20 by switching the switches $\phi_{1,f}^s$ and $\phi_{2,f}^s$, so as to convert the continuous AC signal into a non-continuous AC signal, and transmits the non-continuous AC signal to the waveform multiplier 22. The waveform multiplier 22 switches the switches $\phi_{1,2dfc}$ and $\phi_{2,2dfc}$ to achieve the effect of using the square wave generator and the analogous multiplier without linearity issue. The waveform multiplier 22 receives the non-continuous AC signal from the fully-differential periodically resetting integrated switched-capacitor sampling and holding circuit 36, and multiplies the non-continuous AC signal by the square wave signal whose frequency is integer times the carrier frequency to obtain the first output signal. The capacitors $C_{I1M}$ and $C_{I1P}$ of the fully-differential correlated-double sampling switched-capacitor circuits 38 and 38' calibrate an operation error of the operation amplifier 42 by periodically switching switches $\phi_{1,f}^s$ $\phi_{2,f}^s$. The continuous-time filter 24 filters out the high-frequency signal of the first output signal to generate the second output signal. Finally, the fully-differential periodically resetting integrated switched-capacitor circuits 40 and 40' reset the discrete-time angle demodulation signal to zero. Specifically, after the integration period, the capacitor is discharged, otherwise an incorrect integration result is generated or the output signal of the operational amplifier 42 is saturated. As a result, the fully-differential periodically resetting integrated switched-capacitor circuits

40 and 40' use two equal capacitors ($C_{I3P}$ and $C_{I4P}$) to replace each other. When the capacitor $C_{I3P}$ is integrated, the capacitor $C_{I4P}$ is discharged. After a period, the capacitor $C_{I4P}$ is integrated, the capacitor $C_{I3P}$ is discharged for a next period. Thus, the function of periodically resetting integration is continuously performed whereby the signal is still demodulated during the capacitor is discharged.

Using the discrete-time PRI has a lot of advantages. 1. Resistors are not used, and reduce capacitance to design an integrated circuit (IC). 2. More deeply tolerate the variation for fabrication process, voltage, and temperature, and precisely design the frequency response of the PRI to improve the yield of a chip. 3. The problem that the traditional technology is hard to achieve the best linearity by using an analogous multiplier and a square wave generator is resolved. And, the waveform multiplier 22 replaces the two analogous circuits of the traditional technology by integrating the PRI 26 and the waveform multiplier 22, so that the demodulation circuit possesses well linearity.

Figure 6:
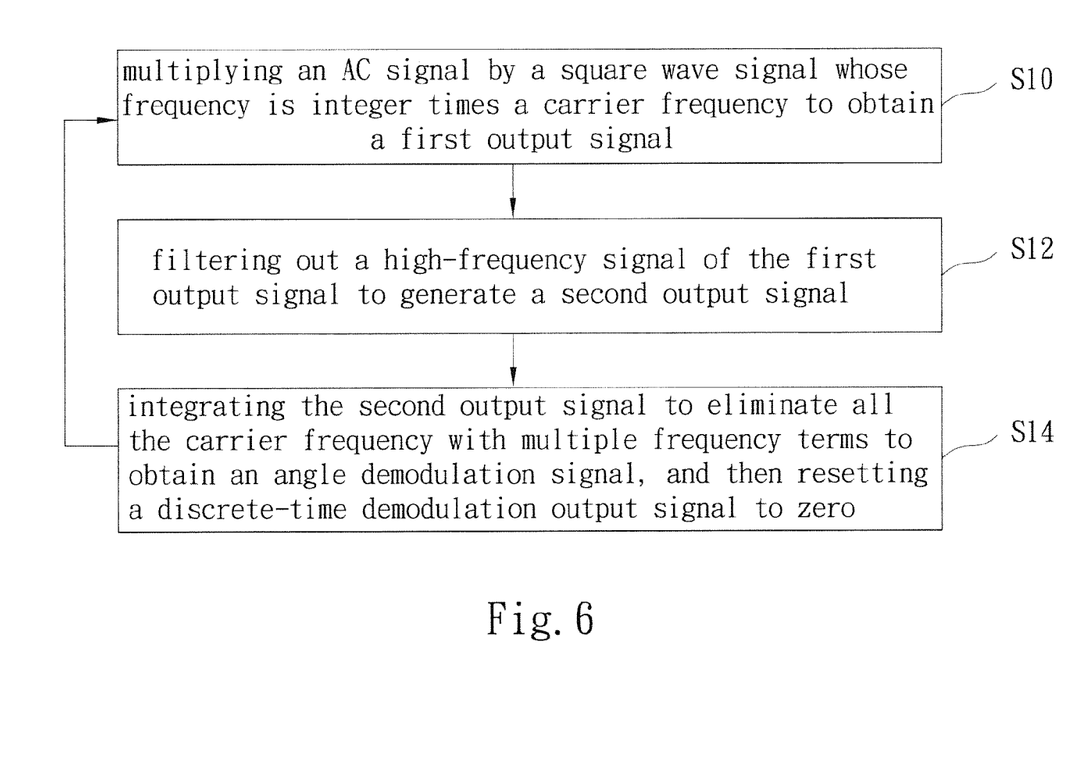
FIG. 6 is a flowchart illustrating steps according to an embodiment of the present invention.

Refer to FIG. 2B and FIG. 6. FIG. 6 is a flowchart of the present invention. In Steps S10, multiply an AC signal by a square wave signal whose frequency is integer times a carrier frequency to obtain a first output signal, wherein the square wave signal is generated by the square wave generator. In Step S12, the continuous-time filter 24 filters out the high-frequency signal of the first output signal to generate a second output signal. Finally, the PRI 26 integrates the second output signal to eliminate all the carrier frequency with multiple frequency terms to obtain an angle demodulation signal, and then resets an output signal of the operational amplifier therein, namely a discrete-time demodulation output signal, to zero, and continues repeating Step S10, thereby continuing performing the function of periodically resetting integration.

In conclusion, the present invention uses periodically resetting integration to reduce circuit elements required and effectively obtains the angle modulation signal with high precision. For example, analogous multipliers, frequency multipliers, continuous-time analogous band-pass filters and phase lock circuits of the traditional technology are omitted. Further, the simple circuit of the present invention can greatly reduce the difficulty for designing an optical sensing module in the front end without limiting the modulation depth, effectively resolve the problem of linearity and signal distortion of circuits, and reduce capacitances used whereby an integrated circuit can be realized. Therefore, the present invention achieves a small volume, high speed, high sensitivity, high reliability, high performance and high condition-adapting properties.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A periodically resetting integration angle demodulation device comprising:
a waveform multiplier receiving an angle modulation signal derived, from a sensed signal angle variation applied to a carrier, multiplying said angle modulation signal by a square wave signal to obtain a first output signal, the square wave signal having a frequency related in value to a carrier frequency of the angle modulation signal by a predetermined integer multiplication factor;
a continuous-time filter coupled to said waveform multiplier, said continuous-time filter receiving said first output signal and filtering out a high-frequency component of said first output signal to generate a second output signal; and
a periodically resetting integrator (PRI) coupled to said continuous-time filter, said periodically resetting integrator receiving said second output signal and integrating said second output signal over a plurality of integration periods sequentially disposed in time to obtain a plurality of angle demodulation signal segments, said periodically resetting integrator resetting an angle demodulation signal segment output to zero after each integration period to eliminate multiple frequency terms associated with the carrier;
wherein the angle demodulation signal segments collectively indicate the sensed signal angle variation.

2. The periodically resetting integration angle demodulation device according to claim 1, wherein said continuous-time filter is a continuous-time low-pass filter or a continuous-time band-pass filter.

3. The periodically resetting integration angle demodulation device according to claim 1, further comprising a direct-current (DC) blocker coupled to said waveform multiplier receiving an angle modulation signal to filter out a direct-current (DC) signal of said angle modulation signal, and then sending out an alternative-current (AC) signal to said waveform multiplier.

4. The periodically resetting integration angle demodulation device according to claim 3, wherein said DC blocker receives the angle modulation signal from an optical sensing system.

5. The periodically resetting integration angle demodulation device according to claim 1, further comprising a square wave generator coupled to said waveform multiplier, said square wave generator providing said square wave signal to said waveform multiplier.

6. The periodically resetting integration angle demodulation device according to claim 1, wherein said periodically resetting integrator is a continuous-time periodically resetting integrator or a discrete-time periodically resetting integrator.

7. The periodically resetting integration angle demodulation device according to claim 6, wherein said continuous-time periodically resetting integrator further includes a resistor, an operation amplifier, a capacitor and a switch, and said resistor is coupled to said continuous-time filter and an input of said operation amplifier, and said capacitor is coupled to said resistor and an output of said operation amplifier, and said switch is coupled to said capacitor in parallel; said second output signal charges said capacitor through said resistor, and after said operation amplifier performs integration, said switch switches a conduction state thereof to discharge said capacitor.

8. The periodically resetting integration angle demodulation device according to claim 6, wherein said waveform multiplier is incorporated in said discrete-time periodically resetting integrator, and said discrete-time periodically resetting integrator further includes a fully-differential periodically resetting integrated switched-capacitor sampling and holding circuit, fully-differential correlated-double sampling switched-capacitor circuits, fully-differential periodically resetting integrated switched-capacitor circuits and an operation amplifier, and said fully-differential periodically resetting integrated switched-capacitor sampling and holding circuit is coupled to said waveform multiplier, and said fully-differential correlated-double sampling switched-capacitor circuits are coupled to said waveform multiplier and an input of said operation amplifier, and said fully-differential periodically resetting integrated switched-capacitor circuits are respectively coupled to said fully-differential correlated-double sampling switched-capacitor circuits and an output of said operation amplifier; and said waveform multiplier receives a non-continuous alternative-current (AC) signal from said fully-differential periodically resetting integrated switched-capacitor sampling and holding circuit, and multiplies said non-continuous AC signal by said square wave signal to obtain said first output signal, and said fully-differential correlated-double sampling switched-capacitor circuits calibrate an operation error of said operation amplifier by periodically switching switches, and said continuous-time filter filters out a high-frequency signal of said first output signal to generate said second output signal, and said fully-differential periodically resetting integrated switched-capacitor circuits reset an output signal of said operation amplifier to zero.

9. A periodically resetting integration angle demodulation method comprising:

receiving an angle demodulation signal derived from a sensed signal angle variation applied to a carrier;

multiplying the angle modulation signal by a square wave signal to obtain a first output signal, the square wave signal having a frequency related in value to a carrier frequency of the angle modulation signal by a predetermined integer multiplication factor;

filtering out a high-frequency component of said first output signal to generate a second output signal; and integrating said second output signal over a plurality of integration periods sequentially disposed in time to obtain a plurality of angle demodulation signal segments, said periodically resetting integrator resetting an angle demodulation signal segment output to zero after each integration period to eliminate multiple frequency terms associated with the carrier;

wherein the angle demodulation signal segments collectively indicate the sensed signal angle variation.

* * * * *